United States Patent
Ghosh et al.

(10) Patent No.: US 10,386,731 B2
(45) Date of Patent: *Aug. 20, 2019

(54) SHADOW-MASK-DEPOSITION SYSTEM AND METHOD THEREFOR

(71) Applicant: eMagin Corporation, Hopewell Junction, NY (US)

(72) Inventors: Amalkumar P. Ghosh, Hopewell Junction, NY (US); Fridrich Vazan, Pittsford, NY (US); Munisamy Anandan, Austin, TX (US); Evan Donoghue, Hopewell Juntion, NY (US); Ilyas I. Khayrullin, Hopewell Junction, NY (US); Tariq Ali, Hopewell Junction, NY (US); Kerry Tice, Hopewell Junction, NY (US)

(73) Assignee: eMagin Corporation, Hopewell Junction, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/602,939

(22) Filed: May 23, 2017

(65) Prior Publication Data

US 2017/0343901 A1 Nov. 30, 2017

Related U.S. Application Data

(60) Provisional application No. 62/340,793, filed on May 24, 2016.

(51) Int. Cl.
*G03F 7/20* (2006.01)
*C23C 14/04* (2006.01)
(Continued)

(52) U.S. Cl.
CPC ............ *G03F 7/707* (2013.01); *C23C 14/042* (2013.01); *C23C 14/30* (2013.01); *C23C 14/50* (2013.01); *C23C 14/54* (2013.01)

(58) Field of Classification Search
CPC ....................................................... G03F 7/707
See application file for complete search history.

(56) References Cited

U.S. PATENT DOCUMENTS

| 4,393,131 A | 7/1983 | Whalin et al. |
| 4,902,377 A | 2/1990 | Berglund et al. |
| (Continued) | | |

FOREIGN PATENT DOCUMENTS

| CN | 1461234 A | 12/2003 |
| CN | 1522098 A | 8/2004 |
| (Continued) | | |

OTHER PUBLICATIONS

"Final Office Action", U.S. Appl. No. 14/941,825, dated Nov. 14, 2017, 11 pp.
(Continued)

*Primary Examiner* — Deoram Persaud
(74) *Attorney, Agent, or Firm* — Kaplan Breyer Schwarz, LLP

(57) ABSTRACT

A direct-deposition system capable of forming a high-resolution pattern of material on a substrate is disclosed. Vaporized atoms from an evaporation source pass through a pattern of through-holes in a shadow mask to deposit on the substrate in the desired pattern. The shadow mask is held in a mask chuck that enables the shadow mask and substrate to be separated by a distance that can be less than ten microns. As a result, the vaporized atoms that pass through the shadow mask exhibit little or no lateral spread (i.e., feathering) after passing through its apertures and the material deposits on the substrate in a pattern that has very high fidelity with the aperture pattern of the shadow mask.

33 Claims, 9 Drawing Sheets

(51) Int. Cl.
*C23C 14/30* (2006.01)
*C23C 14/50* (2006.01)
*C23C 14/54* (2006.01)

(56) References Cited

U.S. PATENT DOCUMENTS

| | | | |
|---|---|---|---|
| 6,287,436 | B1 | 9/2001 | Pelletier et al. |
| 7,282,240 | B1 | 10/2007 | Jackman et al. |
| 7,615,161 | B2 | 11/2009 | Hoffman |
| 7,977,868 | B2 | 7/2011 | Shieh et al. |
| 8,673,077 | B2 | 3/2014 | Sonoda et al. |
| 8,742,658 | B2 | 6/2014 | Yu et al. |
| 8,879,766 | B1 | 11/2014 | Zhang |
| 8,940,568 | B2 | 1/2015 | Mohan et al. |
| 9,142,779 | B2 | 9/2015 | Chan et al. |
| 2002/0180331 | A1 | 12/2002 | Fukumoto |
| 2004/0142108 | A1 | 7/2004 | Atobe et al. |
| 2004/0197675 | A1 | 10/2004 | Shibata et al. |
| 2004/0219465 | A1 | 11/2004 | Meijer et al. |
| 2005/0212419 | A1 | 9/2005 | Vazan et al. |
| 2007/0024831 | A1* | 2/2007 | Hibbs ............ G03F 7/707 355/53 |
| 2007/0099395 | A1 | 5/2007 | Sridhar et al. |
| 2007/0246705 | A1 | 10/2007 | Li et al. |
| 2009/0091238 | A1 | 4/2009 | Cok et al. |
| 2010/0297349 | A1 | 11/2010 | Lee et al. |
| 2012/0178190 | A1 | 7/2012 | Krijne et al. |
| 2013/0168231 | A1 | 7/2013 | Yang et al. |
| 2013/0320837 | A1 | 12/2013 | Weaver et al. |
| 2013/0344612 | A1 | 12/2013 | Zuo |
| 2014/0342102 | A1* | 11/2014 | Ambrose ............ C23C 16/042 427/569 |
| 2015/0041793 | A1 | 2/2015 | Chan et al. |
| 2015/0275351 | A1 | 10/2015 | Lee et al. |
| 2015/0338751 | A1 | 11/2015 | Ogura et al. |
| 2015/0380652 | A1 | 12/2015 | Chan et al. |
| 2016/0141498 | A1 | 5/2016 | Ghosh et al. |
| 2016/0194747 | A1 | 7/2016 | Kawato et al. |
| 2016/0201195 | A1* | 7/2016 | Lee ..................... B05B 1/14 239/132 |
| 2017/0092862 | A1 | 3/2017 | Obata et al. |
| 2017/0342542 | A1 | 11/2017 | Ghosh et al. |
| 2017/0342543 | A1 | 11/2017 | Ghosh et al. |
| 2017/0343901 | A1 | 11/2017 | Ghosh et al. |

FOREIGN PATENT DOCUMENTS

| | | |
|---|---|---|
| CN | 102482759 A | 5/2012 |
| CN | 103282543 A | 9/2013 |
| EP | 2168644 A1 | 3/2010 |
| RU | 2032765 C1 | 4/1995 |
| RU | 2155204 C2 | 8/2000 |
| RU | 2538891 C2 | 1/2015 |
| RU | 2014138799 A | 4/2016 |
| RU | 2588921 C2 | 7/2016 |
| TW | 201100577 A | 1/2011 |
| WO | 2000008228 A1 | 2/2000 |
| WO | 2002024321 A1 | 3/2002 |
| WO | 2010113102 A1 | 10/2010 |

OTHER PUBLICATIONS

"Non Final Office Action", U.S. Appl. No. 15/597,635, dated Nov. 17, 2017, 15 pp.

Officer E. Eskina, "International Search Report and the Written Opinion", International Patent Application PCT/US2017/033161, Completed Aug. 11, 2017, 9 pp.

Officer A. Pimenova, "International Search Report and the Written Opinion", International Patent Application PCT/US2017/034203, Completed Aug. 15, 2017, 8 pp.

Officer A. Pimenova, "International Search Report and the Written Opinion", International Patent Application PCT/IB2017/054481, Completed Oct. 25, 2017, 11 pp.

Hyung-Joon Shin et al, "Patterning of ferroelectric nanodot arrays using a silicon nitride shadow mask"; http://adsabs.harvard.edu/abs/2005ApPhL..87k3114S, "Applied Physics Letters", Sep. 2005, vol. 87, No. Issue 11, id. 113114, Publisher: American Institute of Physics, Published in: KR.

Luis Guillermo Villaneuva et al, "Resistless Fabrication of Nanoimprint Lithography (NIL) Stamps Using Nano-Stencil Lithography"; http://www.mdpi.com/2072-666X/4/4/370/htm, "Micromachines", Oct. 15, 2013, vol. 4(4), 370-377, Publisher: MDPI; doi :10.3390/mi4040370, Published in: CH.

"Office Action" issued in related co-pending U.S. Appl. No. 14/941,825, dated Apr. 20, 2017.

Fu-Ching Tung et al., "OLED Fabrication by Using a Novel Planar Evaporation Technique", http://dx/doi.org/10.1155/2014/683037, "International Journal of Photoenergy", Publisher: Hindawi Publishing Corporation, dated Jun. 22, 2014, vol. 2014, Article ID 683037, 8 pages, Published in: TW.

"Non-Final Office Action" received for U.S. Appl. No. 14/941,825, dated Jun. 1, 2018, 13 pages.

"Notice of Allowance" received for U.S. Appl. No. 15/597,635, dated Jun. 6, 2018, 9 pages.

Office Action issued in related Taiwan Application No. 106117271, dated Jan. 17, 2018, pp. 18.

"Taiwan Office Action", Taiwan Patent Application 106117271, dated Jan. 18, 2018, 18 pp.

Non-Final Rejection received for U.S. Appl. No. 15/655,544, dated Dec. 26, 2018, 32 pages.

Final Rejection received for U.S. Appl. No. 14/941,825, dated Dec. 31, 2018, 12 pages.

* cited by examiner

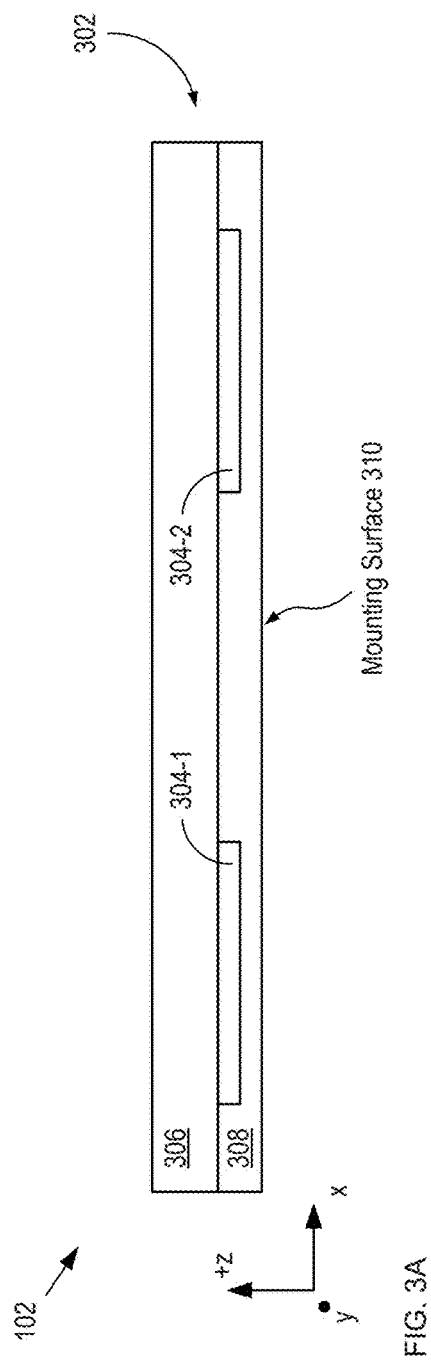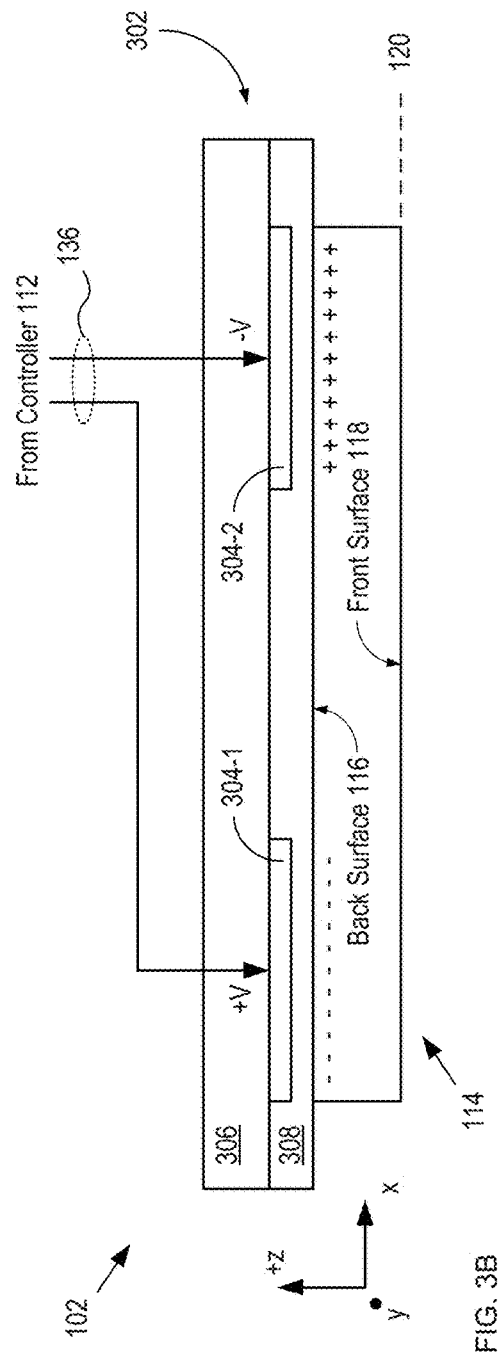

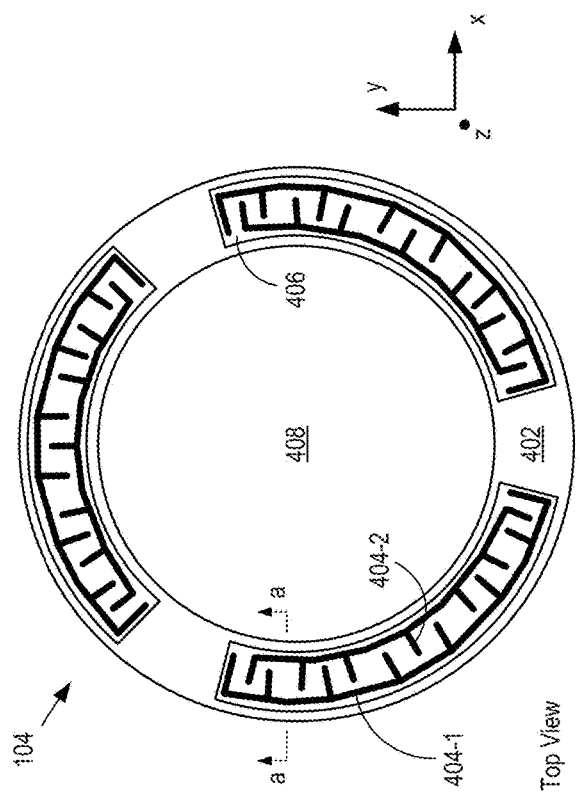
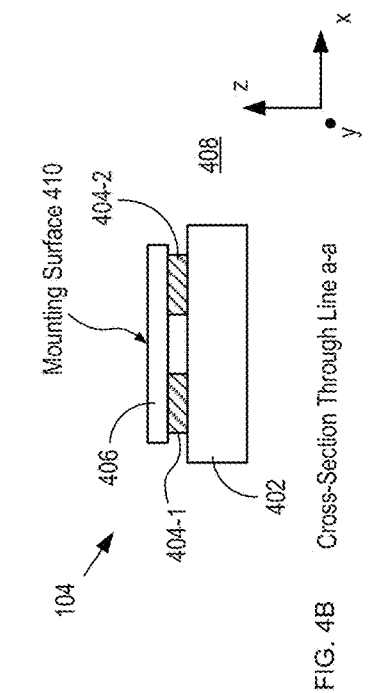
Top View
FIG. 4A
Cross-Section Through Line a-a
FIG. 4B

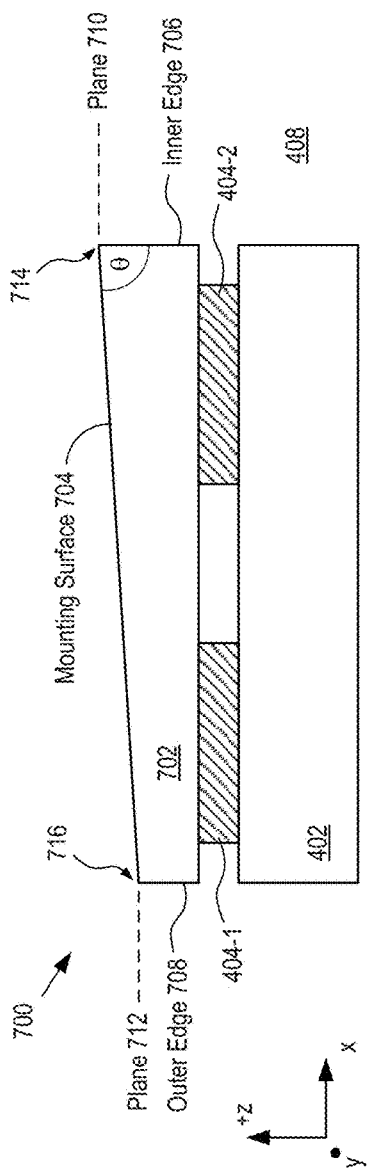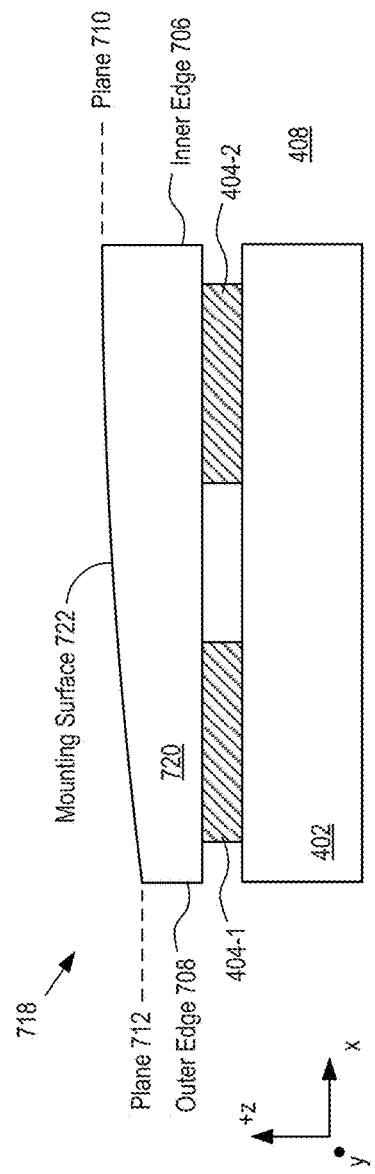

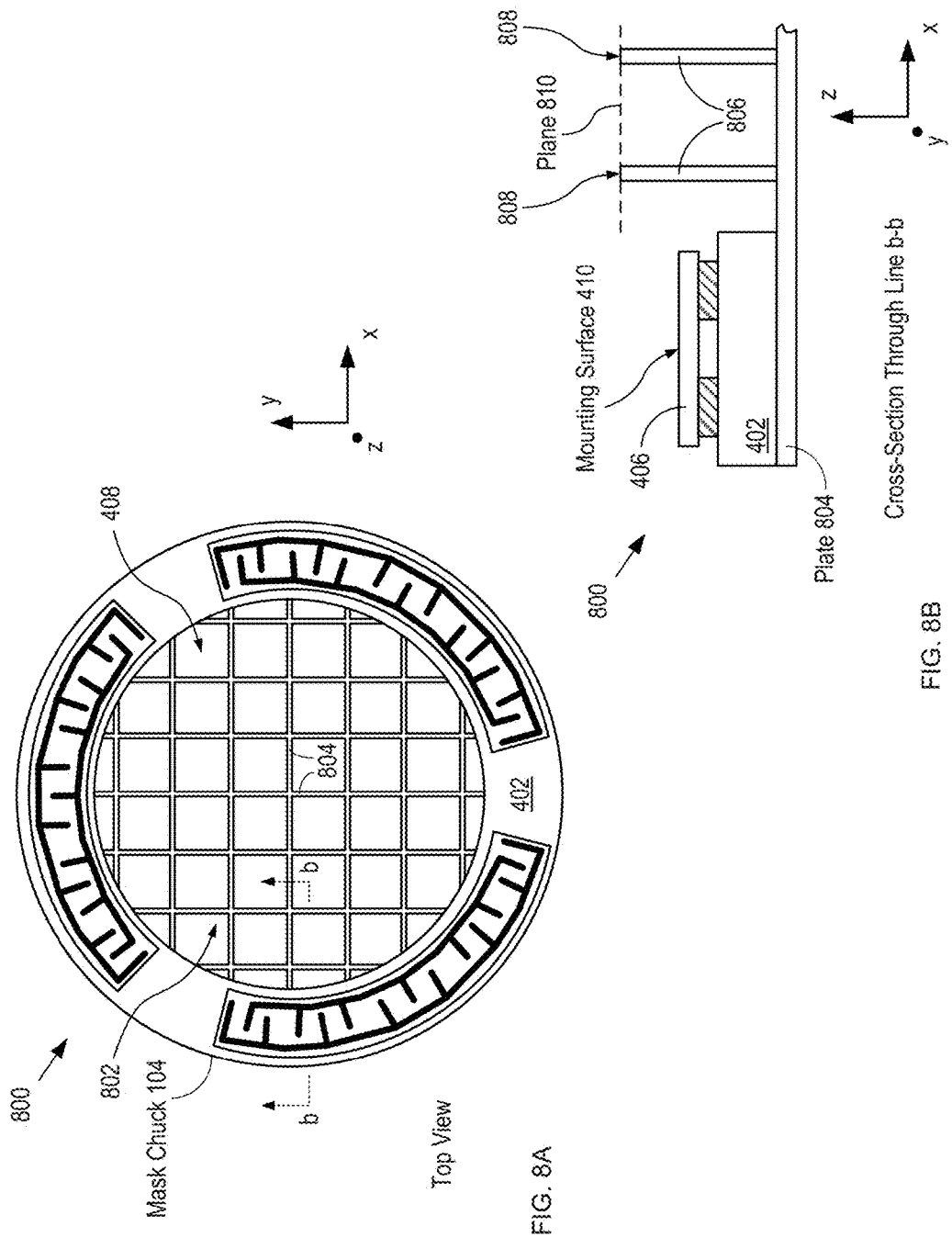

SHADOW-MASK-DEPOSITION SYSTEM AND METHOD THEREFOR

STATEMENT OF RELATED CASES

This case claims priority to U.S. Provisional Patent Application Ser. No. 62/340,793 filed on May 24, 2016, which is incorporated herein by reference.

FIELD OF THE INVENTION

The present invention relates to thin-film deposition in general, and, more particularly, thin-film deposition equipment.

BACKGROUND OF THE INVENTION

Shadow-mask-based deposition is a process by which a layer of material is deposited onto the surface of a substrate such that the desired pattern of the layer is defined during the deposition process itself. This is deposition technique is sometimes referred to as "direct patterning."

In a typical shadow-mask deposition process, the desired material is vaporized at a source that is located at a distance from the substrate, with a shadow mask positioned between them. As the vaporized atoms of the material travel toward the substrate, they pass through a set of through-holes in the shadow mask, which is positioned in contact with or just in front of the substrate surface. The through-holes (i.e., apertures) are arranged in the desired pattern for the material on the substrate. As a result, the shadow mask blocks passage of all vaporized atoms except those that pass through the through-holes, which deposit on the substrate surface in the desired pattern. Shadow-mask-based deposition is analogous to silk-screening techniques used to form patterns (e.g., uniform numbers, etc.) on articles of clothing or stenciling used to develop artwork.

Shadow-mask-based deposition has been used for many years in the integrated-circuit (IC) industry to deposit patterns of material on substrates, due, in part, to the fact that it avoids the need for patterning a material layer after it has been deposited. As a result, its use eliminates the need to expose the deposited material to harsh chemicals (e.g., acid-based etchants, caustic photolithography development chemicals, etc.) to pattern it. In addition, shadow-mask-based deposition requires less handling and processing of the substrate, thereby reducing the risk of substrate breakage and increasing fabrication yield. Furthermore, many materials, such as organic materials, cannot be subjected to photolithographic chemicals without damaging them, which makes depositing such materials by shadow mask a necessity.

Unfortunately, the feature resolution that can be obtained by conventional shadow-mask deposition is diminished due to the fact that the deposited material tends to spread laterally after passing through the shadow mask—referred to as "feathering." Feathering increases with the magnitude of the separation between the substrate and the shadow mask. As a result, this separation is typically kept as small as possible without compromising the integrity of the chucks that hold the substrate and shadow mask. Still further, any non-uniformity in this separation across the deposition area will give rise to variations on the amount of feathering. Such non-uniformity can arise from, for example, a lack of parallelism between the substrate and shadow mask, bowing or sagging of one or both of the substrate and shadow mask, and the like.

Unfortunately, it can be difficult to hold the shadow mask and substrate close enough to avoid giving rise to significant amounts of feathering. Furthermore, a shadow mask must be supported only at its perimeter to avoid blocking the passage of the vaporized atoms to the through-hole pattern. As a result, the center of the shadow mask can sag due to gravity, which further exacerbates feathering issues.

In practice, therefore, critical features formed by prior-art shadow-mask-based deposition techniques are typically separated by relatively large areas of open space to accommodate feathering, which limits the device density that can be obtained. For example, each pixel of an active-matrix organic light-emitting-diode (AMOLED) display normally includes several regions of organic light-emitting material, each of which emits a different color of light. Due to feathering issues, prior-art AMOLED displays have typically been restricted to approximately 600 pixels-per-inch (ppi) or less, which is insufficient for many applications, such as near-to-eye augmented reality and virtual-reality applications. In addition, the need for large gaps within and between the pixels gives rise to a reduced pixel fill factor, which reduces display brightness. As a result, the current density through the organic layers must be increased to provide the desired brightness, which can negatively impact display lifetime.

The need for a process that enables high-resolution direct patterning remains unmet in the prior art.

SUMMARY OF THE INVENTION

The present invention enables high-resolution direct deposition of a patterned layer of material on a substrate without some of the costs and disadvantages of the prior art. The present invention enables high-precision alignment of a shadow mask and substrate that are separated by only a few microns. The present invention also provides for mitigation of gravity-induced sag of a shadow mask that is supported only at its perimeter. Embodiments of the present invention are particularly well suited for applications requiring high-density patterns of material on a substrate, such as dense-pixel displays (DPD), high-definition displays, and the like.

An illustrative embodiment of the present invention is a direct-patterning deposition system comprising a first chuck having a first mounting surface for holding a substrate and a second chuck having a second mounting surface for holding a shadow mask that comprises a pattern of through-holes. The second chuck includes a frame that surrounds a central opening that exposes the pattern of though-holes in the shadow mask. As a result, during deposition, vaporized atoms of the material can pass through the second chuck and the through-holes to deposit in a desired pattern on a deposition region of the front surface of the substrate.

The first chuck generates a first electrostatic force that is selectively applied to the back surface of the substrate. The first chuck is also dimensioned and arranged such that it does not project above the front surface of the substrate. In similar fashion, the second chuck generates a second electrostatic force that is selectively applied to the back surface of the shadow mask. The second chuck is also dimensioned and arranged so that it does not project above the front surface of the shadow mask. When the shadow mask and substrate are in alignment for a deposition, no part of either the first and second chuck encroaches into the three-dimensional space between the substrate and the shadow mask. As a result, the substrate and shadow mask can be positioned brought very close during deposition, thereby mitigating feathering.

In some embodiments, at least one of the first and second attractive forces is a force other than electrostatic, such as a vacuum-generated force, a magnetic force, etc.

In some embodiments, the second mounting surface is dimensioned and arranged to create a tensile stress in the front surface of the shadow mask that mitigates gravity-induced sag of its central region. In some such embodiments, the frame of the second chuck is shaped such that its mounting surface slopes away from top edge of the inner perimeter of the frame. As a result, when the shadow mask is mounted in the second chuck, the shadow mask becomes slightly bowed, which induces a tensile stress in the front surface of the shadow mask. In some of these embodiments, the mounting surface is curved downward from the top edge of the inner perimeter of the frame.

An embodiment of the present invention is a system for depositing a pattern of material on a first region of a substrate through an arrangement of through-holes in a shadow mask, wherein the substrate includes a first major surface and a second major surface that comprises the first region, and wherein the shadow mask includes a third major surface and a fourth major surface that comprises the through-holes, the system comprising: a first chuck for holding the substrate, the first chuck being dimensioned and arranged to selectively impart a first attractive force on the first major surface; a second chuck for holding the shadow mask, the second chuck comprising a frame that surrounds a first opening that enables the material to pass through the second chuck to the through-holes, the second chuck being dimensioned and arranged to selectively impart a second attractive force on the third major surface; and an alignment system for controlling the relative position of the first chuck and the second chuck to align the shadow mask and the substrate.

Another embodiment of the present invention is a system for depositing a pattern of material on a first region of a substrate through an arrangement of through-holes in a shadow mask, wherein the substrate includes a first major surface and a second major surface having a first lateral extent, the second major surface comprising the first region, and wherein the shadow mask includes a third major surface and a fourth major surface that comprises the through-holes, the system comprising: a first chuck for holding the substrate; and a second chuck for holding the shadow mask, the second chuck comprising a frame that surrounds a first opening that enables the material to pass through the second chuck to the through-holes; wherein, when the shadow mask and substrate are aligned, the shadow mask and substrate collectively define a second region, the second region (1) having a second lateral extent that is equal to or larger than the first lateral extent, (2) having a thickness that is equal to a separation between the substrate and the shadow mask, and (3) excluding the first chuck and the second chuck; and wherein the first chuck and second chuck are dimensioned and arranged to enable the thickness to be greater than 0 microns and equal to or less than 10 microns.

Yet another embodiment of the present invention is a method for depositing a pattern of material on a first region of a substrate through an arrangement of through-holes in a shadow mask, wherein the substrate includes a first major surface and a second major surface having a first lateral extent, the second major surface comprising the first region, and wherein the shadow mask includes a third major surface and a fourth major surface that comprises the through-holes, the method comprising: holding the substrate in a first chuck that imparts a first attractive force selectively on the first major surface; holding the shadow mask in a second chuck that imparts a second attractive force selectively on the third major surface, wherein the second chuck enables the passage of particles comprising the material through the second chuck to the through-holes; aligning the substrate and the shadow mask such that the second major surface and the fourth major surface are separated by a distance that is greater than 0 microns and less than or equal to 10 microns; and passing a flow of particles comprising the material through the second chuck and the shadow mask.

BRIEF DESCRIPTION OF THE DRAWINGS

FIG. 3A depicts a schematic drawing of a cross-sectional view of a mask chuck in accordance with the illustrative embodiment.

FIG. 3B depicts a schematic drawing of a cross-sectional view of substrate chuck 102 while holding substrate 114.

FIGS. 4A-B depicts a schematic drawings of top and cross-section views, respectively, of a mask chuck in accordance with the illustrative embodiment.

FIG. 7A depicts a schematic drawing of a cross-sectional view of a portion of a mask chuck in accordance with a first alternative embodiment of the present invention.

FIG. 7B depicts a schematic drawing of a cross-sectional view of a portion of a mask chuck in accordance with a second alternative embodiment of the present invention.

FIGS. 8A-B depict schematic drawings of top and cross-section views, respectively, of a mask chuck in accordance with a third alternative embodiment of the present invention.

DETAILED DESCRIPTION

Figure 9:
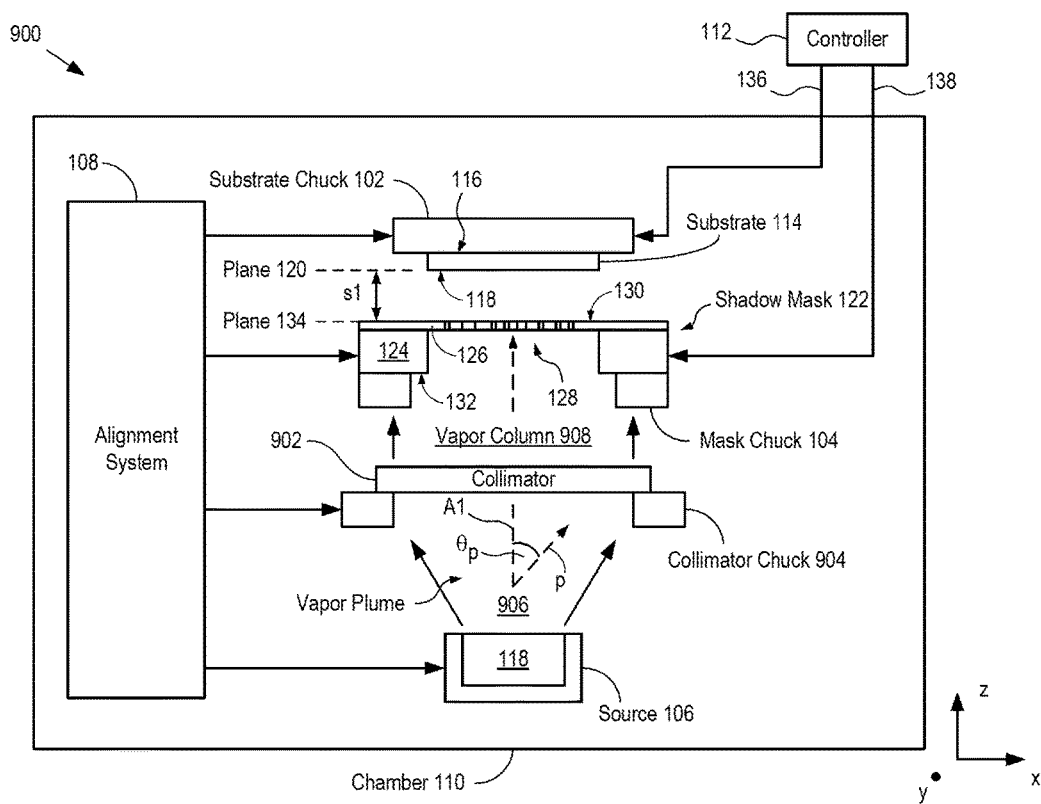
FIG. 9 depicts a schematic drawing of the salient features of a high-precision, direct-patterning deposition system in accordance with a fourth alternative embodiment of the present invention.

FIG. 9 depicts a schematic drawing of the salient features of a high-precision, direct-patterning deposition system in accordance with a fourth alternative embodiment of the present invention.

System 100 is described herein with respect to the deposition of a pattern of light-emitting organic material on a glass substrate as part of the fabrication of an AMOLED display. However, it will be clear to one skilled in the art, after reading this Specification, that the present invention can be directed toward the formation of directly patterned layers of virtually any thin- and thick-film material (organic or inorganic) on any of a wide range of substrates, such as semiconductor substrates (e.g., silicon, silicon carbide, germanium, etc.), ceramic substrates, metal substrates, plastic substrates, and the like. Further, although the illustrative embodiment is a thermal evaporation system, one skilled in the art will recognize, after reading this Specification, that the present invention can be directed toward virtually any material-deposition process, such as e-beam evaporation, sputtering, and the like. Still further, although the depicted example is a deposition system suitable for use in single-substrate planar processing, the present invention is also suitable for use in other fabrication approaches, such as cluster-tool processing, track processing, roll-to-roll processing, reel-to-reel processing, etc. As a result, the present invention is suitable for use in myriad applications including, without limitation, packaging applications, integrated-circuit fabrication, MEMS fabrication, nanotechnology device fabrication, ball-grid array (BGA) fabrication, and the like.

Substrate chuck 102 is a platen for holding substrate 114 via an attractive force applied only to its back surface. In the depicted example, substrate chuck 102 generates electrostatic force to hold a substrate; however, in some embodiments, substrate chuck 102 holds a substrate via a different attractive force, such as a vacuum-generated force, a magnetic force, etc. For the purposes of this Specification, including the appended claims, the term "magnetic force" includes any force arising from the use of permanent magnets and/or electromagnets. Substrate chuck 102 is described in more detail below and with respect to FIGS. 3A-B.

In the depicted example, substrate 114 is a glass substrate suitable for use in active-matrix organic-light-emitting-diode (AMOLED) displays. Substrate 114 includes two major surfaces—back surface 116 and front surface 118, on which the display elements are defined. Front surface 118 defines plane 120.

Mask chuck 104 is a fixture for holding shadow mask 122 via an attractive force imparted on only its back surface. In the depicted example, mask chuck 104 holds shadow mask 122 using electrostatic force. In some embodiments, mask chuck 104 holds a shadow mask via a different attractive force, such as a vacuum-generated force, a magnetic force, etc. Mask chuck 104 is described in more detail below and with respect to FIGS. 4A-B.

In the depicted example, shadow mask 122 is a high-precision shadow mask comprising handle substrate 124 and membrane 126, which is suspended over a central opening formed in the handle substrate. Membrane 126 includes through-hole pattern 128. Shadow mask 122 includes two major surfaces—front surface 130 and back surface 132. Front surface 130 is the top surface of membrane 126 (i.e., the membrane surface distal to handle substrate 124), which defines plane 134. Back surface 132 is the surface of handle substrate 124 (i.e., the substrate surface distal to membrane 126). It should be noted that, while shadow mask 122 is a high-precision, membrane-based shadow mask, mask chucks in accordance with the present invention can be used to hold virtually any type of shadow mask.

Source 106 is a crucible for vaporizing material 118, which is an organic material that emits light at a desired wavelength. In the depicted example, source 106 is a single-chamber crucible that is centered with respect to substrate 114; however, in some embodiments, source 106 includes a plurality of chambers that are arranged in one- and/or two-dimensional arrangements. When material 118 is melted or sublimed within the low-pressure atmosphere of chamber 110, vaporized atoms of material 118 are ejected from the source and propagate toward substrate 114 in substantially ballistic fashion.

Alignment system 108 is a high-precision alignment system for controlling the relative position between substrate 114 and shadow mask 122. In the depicted example, alignment system 108 is capable of independently controlling the position of each of substrate chuck 102 and mask chuck 104 in six dimensions. It is also capable of controlling the position of source 106 so that the source can be moved relative to the substrate/shadow mask combination to improve deposition uniformity across the substrate, if desired.

Vacuum chamber 110 is a conventional pressure vessel for containing a low-pressure environment required for the evaporation of material 118. In the depicted example, vacuum chamber 110 is a standalone unit; however, it can also be realized as a part of a cluster deposition system or track-deposition system without departing from the scope of the present invention. In some embodiments, vacuum chamber 110 includes several evaporation sources/shadow mask combinations that enable formation of different patterns of different materials on substrate 114, such as, for example, multiple light-emitting subpixels that emit light at different colors (e.g., red, green, and blue).

Controller 112 is a conventional instrument controller that, among other things, provides control signals 136 and 138 to substrate chuck 102 and mask chuck 104, respectively.

Figure 2:
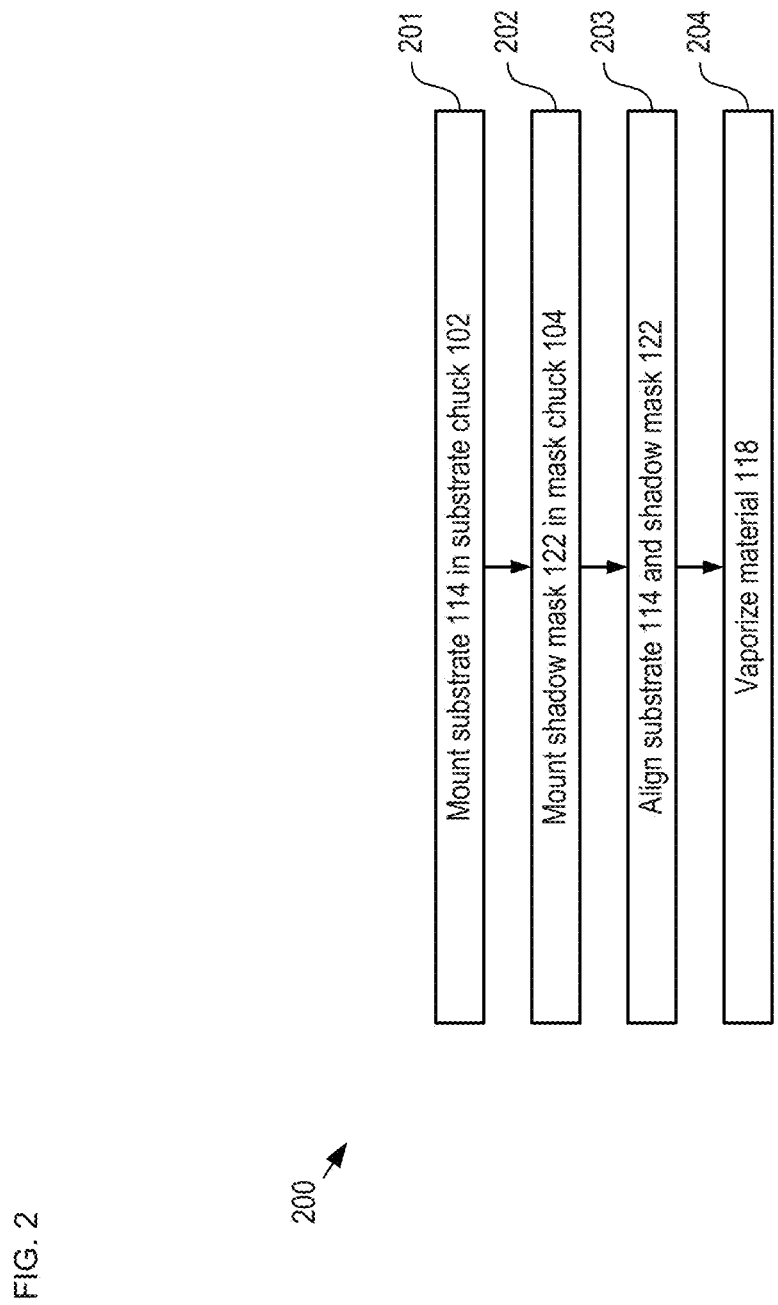
FIG. 2 depicts methods of an operation for forming a patterned layer of material on a substrate in accordance with the illustrative embodiment of the present invention.

FIG. 2 depicts methods of an operation for forming a patterned layer of material on a substrate in accordance with the illustrative embodiment of the present invention. Method 200 begins with operation 201, wherein substrate 114 is mounted in substrate chuck 102.

FIG. 3A depicts a schematic drawing of a cross-sectional view of a mask chuck in accordance with the illustrative embodiment. Mask chuck 102 includes platen 302 and electrodes 304-1 and 304-2.

Platen 302 is a structurally rigid platform comprising substrate 306 and dielectric layer 308. Each of substrate 306 and dielectric layer 308 includes an electrically insulating material, such as glass, ceramic, anodized aluminum, composite materials, Bakelite, and the like to electrically isolate electrodes 304-1 and 304-2 from each other and from substrate 114 when it is mounted in the substrate chuck.

Electrodes 304-1 and 304-2 are electrically conductive elements formed on the surface of substrate 306 and overcoated by dielectric layer 308 to embed them within platen 302. Electrodes 304-1 and 304-2 are electrically coupled with controller 112. It should be noted that electrodes 304-1 and 304-2 are depicted as simple plates; however, in practice, mask chuck 102 can have electrodes that are shaped in any manner, such as interdigitated comb fingers, concentric rings, irregular shapes, etc.

Dielectric layer 308 is a structurally rigid layer of glass disposed over electrodes 304-1 and 304-2 to give rise to mounting surface 310.

FIG. 3B depicts a schematic drawing of a cross-sectional view of substrate chuck 102 while holding substrate 114.

To hold substrate 112 in substrate chuck 102, control signal 136 generates a voltage potential between electrodes 304-1 and 304-2. When back surface 116 is brought into contact with mounting surface 310 (i.e., the top surface of dielectric layer 308), sympathetic charge regions develop within substrate 114 as shown. As a result, an electrostatic force is selectively imparted on back surface 116, thereby attracting it to mounting surface 310.

Although the illustrative embodiment includes a substrate chuck that holds substrate 114 via electrostatic force, it will be clear to one skilled in the art, after reading this Specification, how to specify, make, and use alternative embodiments wherein a substrate is held in a substrate chuck via an attractive force other than an electrostatic force, such as a vacuum-generated force, a magnetic force, and the like.

At operation 202, shadow mask 122 is mounted in mask chuck 104.

FIGS. 4A-B depicts a schematic drawings of top and cross-section views, respectively, of a mask chuck in accordance with the illustrative embodiment. The cross-section depicted in FIG. 4B is taken through line a-a shown in FIG. 4A. Mask chuck 104 includes frame 402, electrodes 404-1 and 404-2, and pads 406.

Frame 402 is a structurally rigid circular ring of electrically insulating material. Frame 402 surrounds opening 408, which is sufficiently large to expose the entirety of through-hole pattern 128. In some embodiments, frame 402 has a shape other than circular, such as square, rectangular, irregular, etc. In some embodiments, frame 402 comprises an electrically conductive material that is coated with an electrical insulator.

Electrodes 404-1 and 404-2 are electrically conductive elements formed on the surface of frame 402. Electrodes 404-1 and 404-2 are electrically coupled with controller 112.

Pads 406 are structurally rigid plates of electrically insulating material disposed on electrodes 404-1 and 404-2. Each of pads 406 includes mounting surface 410, against which shadow mask 122 is held when mounted in the mask chuck.

Figure 5:
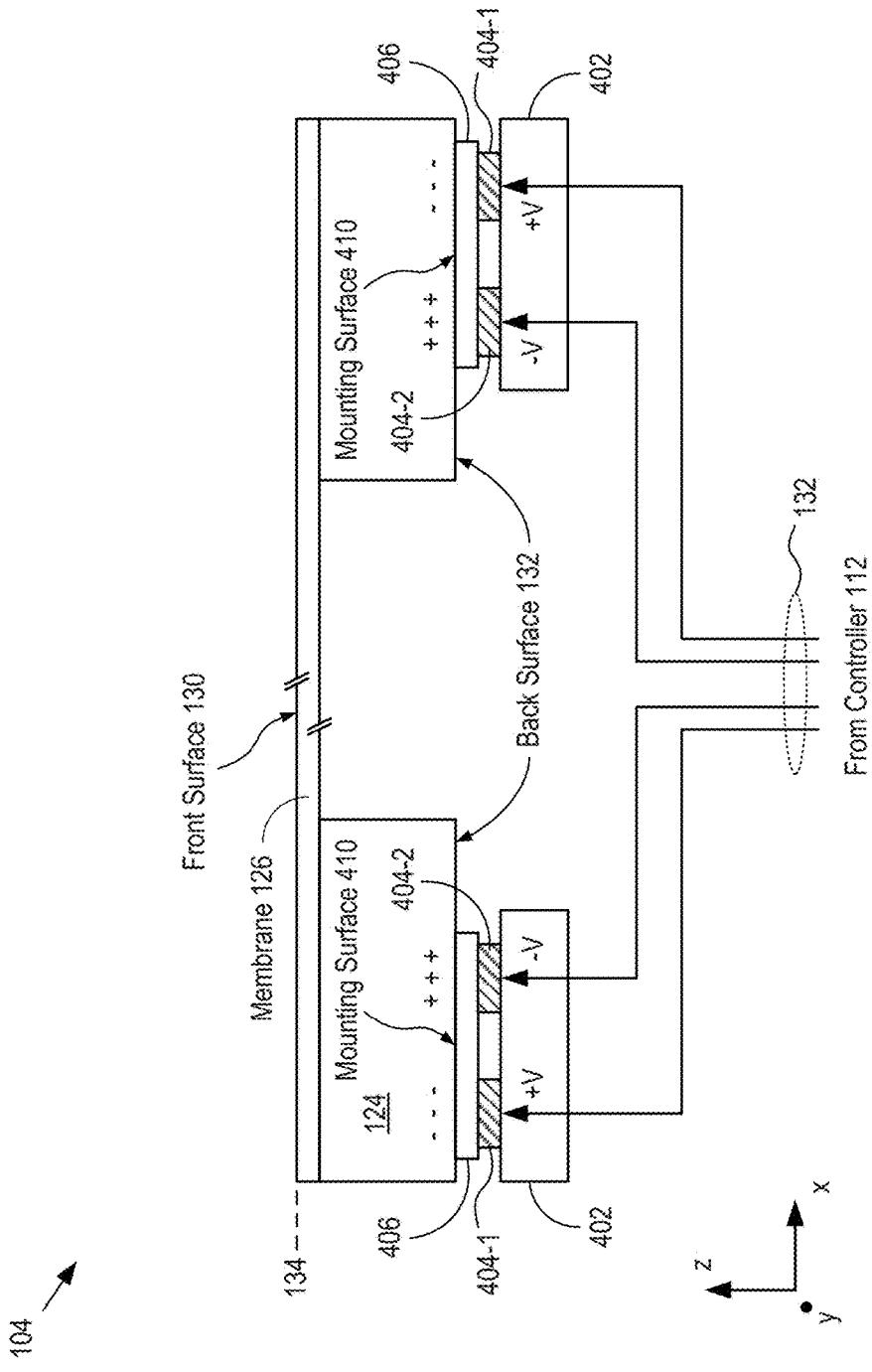
FIG. 5 depicts a cross-sectional view of shadow mask 122 mounted in mask chuck 104.

FIG. 5 depicts a cross-sectional view of shadow mask 122 mounted in mask chuck 104.

Shadow mask 122 is held in mask chuck 104 by an electrostatic force imparted between mounting surface 410 and back surface 132. The electrostatic force arises in response to a voltage potential between electrodes 404-1 and 404-2, which is generated by control signal 138. When back surface 132 is brought into contact with mounting surface 410, sympathetic charge regions develop within handle substrate 124 as shown. As a result, the electrostatic force is selectively imparted between back surface 132 and mounting surface 410.

At operation 203, alignment system 108 aligns substrate 114 and shadow mask 122 by controlling the position of substrate chuck 102. In some embodiments, alignment system aligns the substrate and shadow mask by controlling the position of mask chuck 104. In some embodiments, the positions of both chucks is controlled to align the substrate and shadow mask.

It is an aspect of the present invention that, in some embodiments, neither substrate chuck 102 nor mask chuck 104 includes any structural element that projects past its respective mounting surface. As a result, a substrate and shadow mask can be aligned with little or no separation between them to mitigate feathering during deposition. One skilled in the art will recognize that in conventional direct-deposition systems, the separation between substrate and shadow mask must be at least a few tens, or even hundreds, of microns.

Figure 6:
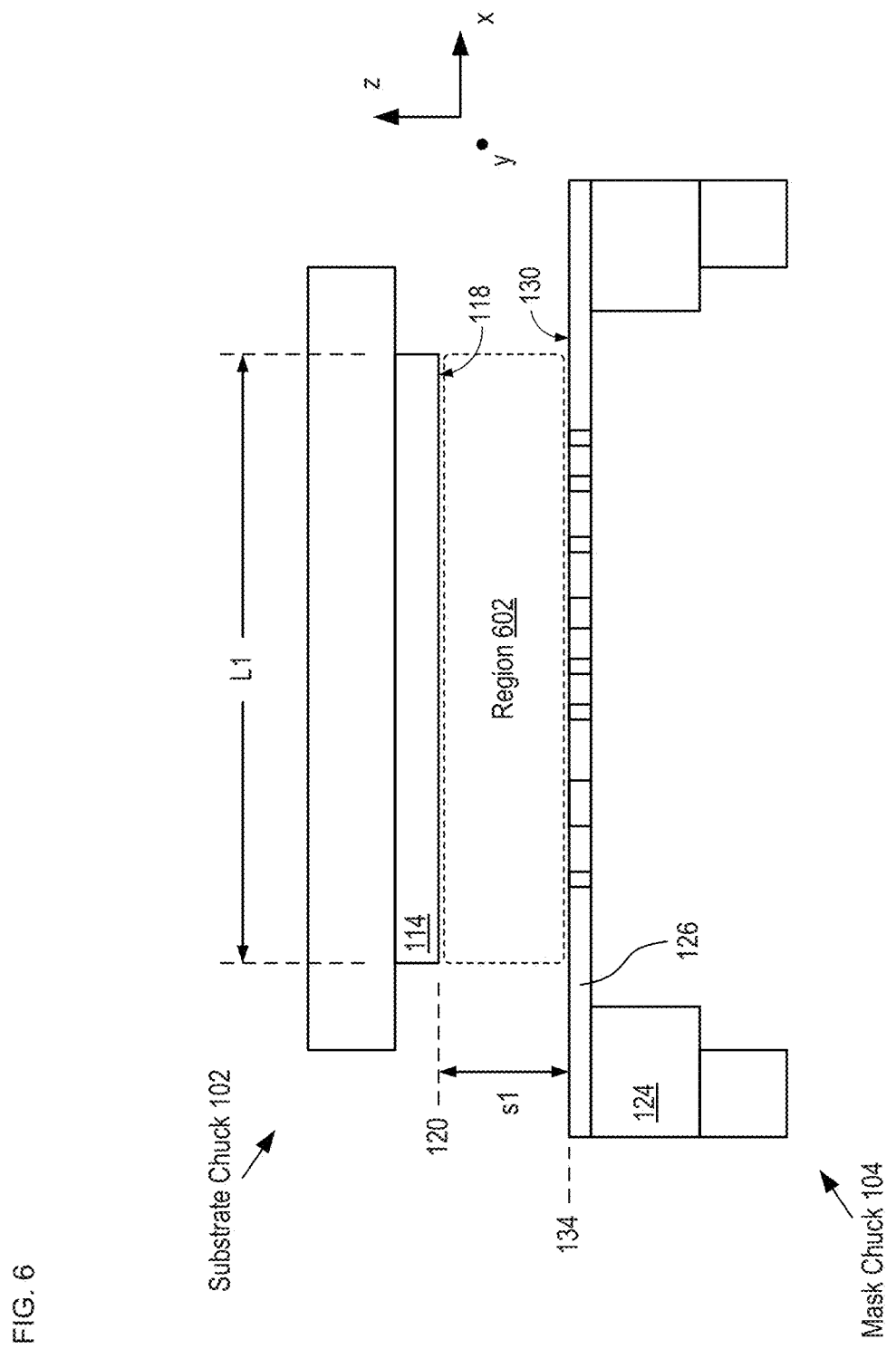
FIG. 6 depicts a schematic drawing of a cross-sectional view of a portion of system 100 with substrate 114 and shadow mask 122 in alignment for deposition of material 118.

FIG. 6 depicts a schematic drawing of a cross-sectional view of a portion of system 100 with substrate 114 and shadow mask 122 in alignment for deposition of material 118.

When the substrate and shadow mask are aligned, they collectively define region 602 between them. Region 602 has a lateral extent, L1, which is equal to that of front surface 118. Region 602 also has a thickness that is equal to the separation, s1, between planes 120 and 134 (i.e., the separation between the substrate and the shadow mask).

Because no portion of substrate chuck 102 extends past plane 120 into region 602, there is no obstruction between the substrate and shadow mask. As a result, separation, s1, between substrate 114 and shadow mask 122 can be extremely small (10 microns). In fact, if desired, the substrate and shadow mask can be brought into contact with one another. The ability to perform direct patterning with a substrate/shadow mask separation equal to or less than 10 microns affords embodiments of the present invention particular advantage over prior-art direct-patterning deposition systems because it enables feathering to be significantly reduced or even eliminated.

At operation 204, source 106 is heated to vaporize material 118 to realize a patterned layer of the material on front surface 118 of substrate 114.

In some embodiments, mask chucks in accordance with the present invention include one or more features that mitigate or eliminate gravity-induced sag of a shadow mask when the shadow mask is mounted. As discussed in detail in U.S. patent application Ser. No. 15/597,635 filed on May 17, 2017, which is incorporated herein by reference, a shadow mask can sag by several microns in the center due to its own mass and the effect of gravity. This gravity-induced sag leads to several significant issues that exacerbate feathering. First, it increases the separation between the shadow mask and the substrate in the center of the deposition region, which is typically centered on the shadow mask. As discussed above, feathering increases with substrate/shadow mask separation distance. Second, it leads to a non-uniform separation between the substrate and the shadow mask, which gives rise to a variation in the degree of feathering that occurs across the substrate surface. The non-uniformity makes it difficult, if not impossible, to compensate for feathering via creative mask layout.

It is yet another aspect of the present invention that a mask chuck can include features that mitigate gravity-induced sag of a shadow mask.

FIG. 7A depicts a schematic drawing of a cross-sectional view of a portion of a mask chuck in accordance with a first alternative embodiment of the present invention. The cross-section depicted in FIG. 7A is taken through line a-a shown in FIG. 4A. Mask chuck 700 includes frame 402, electrodes 404-1 and 404-2, and pads 702.

Pads 702 are analogous to pads 406 described above; however, each pad 702 has a mounting surface that is designed to induce or increase tensile strain in the shadow-mask when it is mounted in the mask chuck. Pad 702 has mounting surface 704, which is linearly tapered downward from inner edge 706 (i.e., the edge proximal to opening 408) to outer edge 708. In other words, mounting surface 704 tapers in the negative z-direction, as shown, from point 714 to point 716 (i.e., where from it meets inner edge 706 at plane 710 to where it meets outer edge 708 at plane 712). In embodiments in which inner edge 706 is perpendicular to plane 710, therefore, inner edge 706 and mounting surface 704 form interior angle, $\theta$, such that it is an acute angle.

When shadow mask 122 is held in mask chuck 700, back surface 132 is attracted to mounting surface 704, thereby inducing a curvature in the shadow mask that increase the laterally directed tension in front surface 130 of the shadow mask. As a result, the membrane is pulled tighter and gravity-induced sag is reduces or eliminated.

FIG. 7B depicts a schematic drawing of a cross-sectional view of a portion of a mask chuck in accordance with a second alternative embodiment of the present invention. The cross-section depicted in FIG. 7B is taken through line a-a shown in FIG. 4A. Mask chuck 718 includes frame 402, electrodes 404-1 and 404-2, and pads 720.

Pads 720 are analogous to pads 406 described above; however, like pads 702, each pad 720 has a mounting surface that is designed to induce or increase tensile strain in the shadow-mask when it is mounted in the mask chuck. Pad 720 has mounting surface 722, which curves downward (i.e., in the negative z-direction, as shown) from inner edge 706 to outer edge 708. In other words, mounting surface 722 tapers in the negative z-direction, as shown, from point 714 to point 716.

When shadow mask 122 is held in mask chuck 718, back surface 132 is attracted to mounting surface 722, thereby inducing a curvature in the shadow mask that increase the laterally directed tension in front surface 130 of the shadow mask. As a result, the membrane is pulled tighter and gravity-induced sag is reduces or eliminated. In some embodiments, the amount of additional tension induced in front surface 130 can be controlled by controlling the magnitude of the voltage differential applied to electrodes 404-1 and 404-2.

Figure 1:
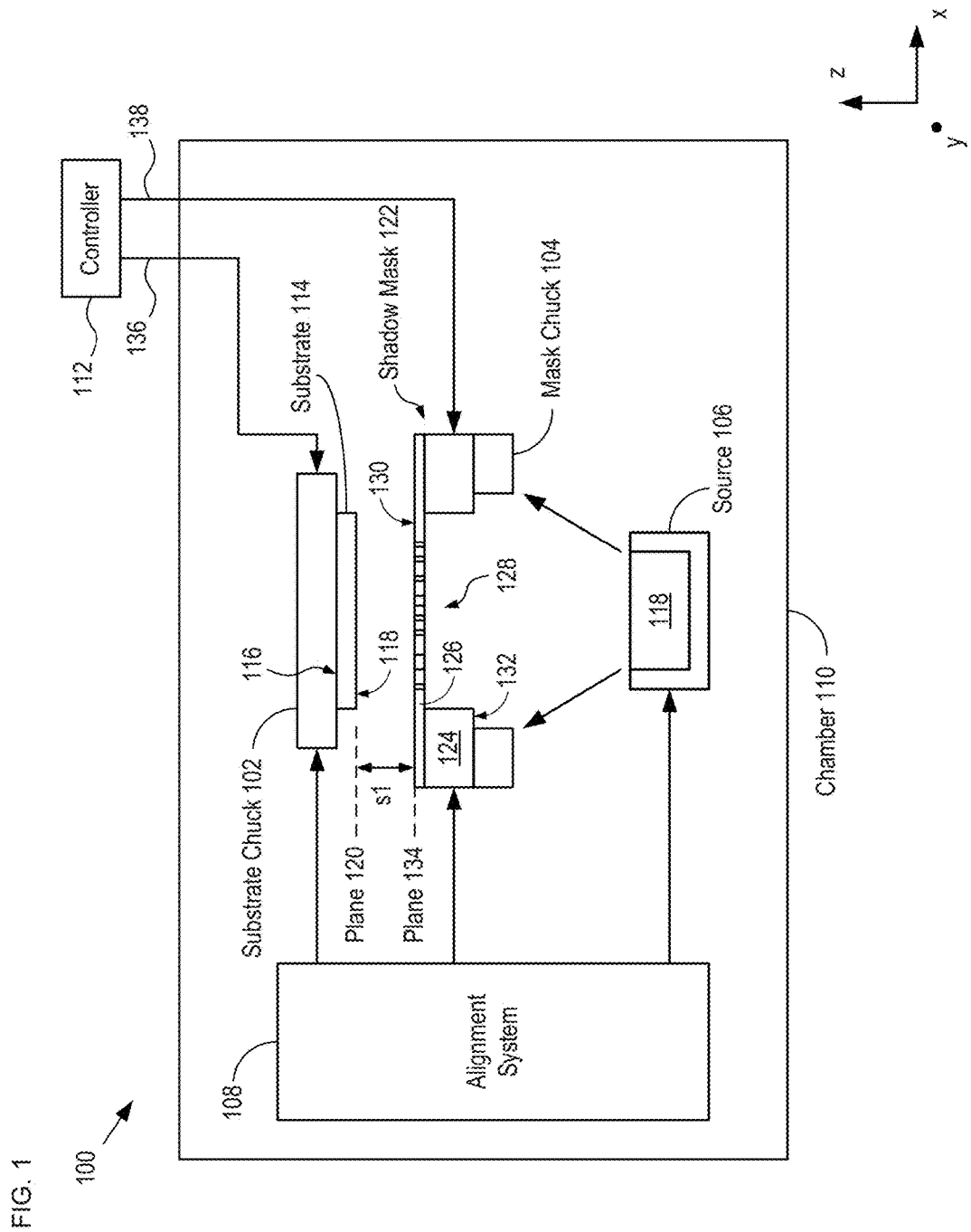
FIG. 1 depicts a schematic drawing of the salient features of a high-precision, direct-patterning deposition system in accordance with an illustrative embodiment of the present invention.

It will be clear to one skilled in the art, after reading this Specification, that the directions in which mounting surfaces 704 and 722 slope (or curve) would be reversed for a deposition system in which the mask were mounted upside down as compared to its orientation depicted in FIG. 1. Further, in such a configuration, it would typically be necessary that substrate chuck 102 be designed to enable substrate 114 to reside within opening 408 to enable a substrate/shadow mask separation of less than or equal to 10 microns.

FIGS. 8A-B depict schematic drawings of top and cross-section views, respectively, of a mask chuck in accordance with a third alternative embodiment of the present invention. Mask chuck 800 includes mask chuck 104 and support grid 802.

Support grid 802 includes plate 804 and support ribs 806.

Plate 804 is a rigid plate from which support ribs 806 extend. In some embodiments, plate 804 and support ribs 806 are machined from a solid body of structural material. Materials suitable for use in plate 804 and support ribs 806 include, without limitation, metals, plastics, ceramics, composite materials, glasses, and the like. Plate 804 is designed to mount to frame 402 to locate support grid 802 within opening 408 such that it mechanically supports membrane 126 when shadow mask 122 is mounted in mask chuck 800.

Support ribs 806 are arranged to support shadow mask 122 in regions that lie between the through-holes of through-hole arrangement 128. Typically, the through-holes of a shadow mask are arranged in clusters that correspond to different die regions on the substrate. Since these die regions are usually separated by "lanes" intended for removal by a dicing saw, support ribs 806 are preferably arranged to match the arrangement of these lanes. It should be noted, however, that any suitable arrangement of support ribs can be used in support grid 802.

Support grid 802 is formed such that their top surfaces 808 are coplanar and define plane 810. Plane 810 lies above mounting surface 410 by a distance equal to the thickness of frame 124. As a result, when frame 124 is in contact with mounting surface 410, support ribs 806 are in contact with membrane 126.

In some embodiments, shadow mask 122 is held upside down in mask chuck 800 such that membrane 126 is in contact with mounting surface 410. In such embodiments, support grid 802 is designed to fit within opening 408 such that plane 810 is coplanar with mounting surface 410. As a result, membrane 126 is supported by support grid 802 such that it is perfectly level all the way across opening 408.

It is to be understood that the disclosure teaches just some embodiments in accordance with the present invention and that many variations of the invention can easily be devised by those skilled in the art after reading this disclosure and that the scope of the present invention is to be determined by the following claims.

FIG. 9 depicts a schematic drawing of the salient features of a high-precision, direct-patterning deposition system in accordance with a fourth alternative embodiment of the present invention. System 900 is analogous to system 100; however, system 900 includes collimator 902 between source 106 and shadow mask 122.

Collimator 902 is a mechanically robust plate comprising a plurality of channels that are separated by thin walls, where the channels are substantially aligned with axis A1, which is normal to plane 120.

Collimator chuck 904 is an annular clamping mechanism for holding and locating the collimator relative to shadow mask 122. Collimator chuck 904 is configured such that collimator 902 can receive vapor plume 906.

In operation, collimator 902 receives vapor plume 906 from source 106 such that the vapor plume includes vaporized atoms propagating along a wide range of propagation angles, $\theta_p$, relative to axis A1. The channels of the collimator are configured to restrict passage of vaporized material through the collimator to only material having propagation directions, p, characterized by propagation angles that are nearly zero, thereby defining vapor column 908. As a result, only vaporized material traveling substantially normal to plane 120 can reach substrate 114, which mitigates feathering across the entirety of the substrate.

What is claimed is:

1. A system for depositing a pattern of material on a first region of a substrate through an arrangement of through-holes in a shadow mask, wherein the substrate includes a first major surface and a second major surface that comprises the first region, and wherein the shadow mask includes a third major surface and a fourth major surface that comprises the through-holes, the system comprising:
   a first chuck for holding the substrate, the first chuck being dimensioned and arranged to selectively impart a first attractive force on the first major surface;
   a second chuck for holding the shadow mask by imparting a second attractive force between the third major surface and the mounting surface, the second chuck comprising a frame that completely surrounds a first opening that enables the material to pass through the second chuck to the through-holes, wherein the frame has an annular mounting surface that is configured to induce a tensile stress in the fourth major surface when the shadow mask is mounted in the second chuck, and wherein the frame has a cross-section in which the mounting surface extends between a first edge that is proximal to the first opening and a second edge that is distal to the first opening, and further wherein the mounting surface and first edge meet at a point in a first plane and the mounting surface and the second edge meet at a point in a second plane, the first plane being closer to the substrate than the second plane when the shadow mask and substrate are aligned; and
   an alignment system for controlling the relative position of the first chuck and the second chuck to align the shadow mask and the substrate.

2. The system of claim 1 wherein the first chuck, second chuck, and alignment system collectively enable alignment of the substrate and shadow mask with a separation between them that is less than or equal to approximately 10 microns.

3. The system of claim 2 wherein the first chuck, second chuck, and alignment system collectively enable alignment of the substrate and shadow mask with a separation between them that is greater than 0 microns and less than or equal to approximately 10 microns.

4. The system of claim 1 wherein the first chuck, second chuck, and alignment system collectively enable alignment of the substrate and shadow mask with a separation between them that is within the range of approximately 2 microns to approximately 5 microns.

5. The system of claim 1 wherein the second attractive force is an electrostatic force.

6. The system of claim 1 wherein the second attractive force is selected from the group consisting of a vacuum-generated force and a magnetic force.

7. The system of claim 1 wherein the mounting surface is non-planar.

8. The system of claim 1 wherein the second chuck further includes a support grid within the first opening, the support grid being dimensioned and arranged to mitigate gravity-induced sag of the shadow mask.

9. The system of claim 1 wherein each of the first attractive force and the second attractive force is an electrostatic force.

10. The system of claim 1 further including:
a source for providing vaporized atoms comprising the material, wherein the source provides the vaporized atoms such that they propagate along directions within a first angular range relative to the second major surface; and
a collimator that is dimensioned and arranged to selectively pass vaporized atoms travelling along directions within a second angular range that is smaller than the first angular range;
wherein the collimator, source, and shadow mask are arranged such that the collimator is between the source and the shadow mask.

11. The system of claim 10 wherein the alignment system is operative for effecting relative motion between the collimator and the substrate during deposition of the pattern of material on the substrate.

12. A system for depositing a pattern of material on a first region of a substrate through an arrangement of through-holes in a shadow mask, wherein the substrate includes a first major surface and a second major surface having a first lateral extent, the second major surface comprising the first region, and wherein the shadow mask includes a third major surface and a fourth major surface that comprises the through-holes, the system comprising:
a first chuck for holding the substrate; and
a second chuck for holding the shadow mask, the second chuck comprising a frame that surrounds a first opening that enables the material to pass through the second chuck to the through-holes, wherein the frame has a mounting surface that is configured to induce a tensile stress in the fourth major surface when the shadow mask is held in the second chuck;
wherein, when the shadow mask and substrate are aligned during a deposition, the shadow mask and substrate collectively define a second region, the second region (1) having a second lateral extent that is equal to or larger than the first lateral extent, (2) having a thickness that is equal to a separation between the substrate and the shadow mask, and (3) excluding the first chuck and the second chuck; and
wherein the first chuck and second chuck are dimensioned and arranged to enable the thickness to be greater than 0 microns and less than 10 microns.

13. The system of claim 12 wherein the frame has a cross-section in which the mounting surface extends between a first edge that is proximal to the first opening and a second edge that is distal to the first opening, and further wherein the mounting surface and first edge meet at a point in a first plane and the mounting surface and the second edge meet at a point in a second plane, the first plane being closer to the substrate than the second plane when the shadow mask and substrate are aligned.

14. The system of claim 12 wherein the second chuck is operative for imparting a first attractive force on only the third major surface.

15. The system of claim 14 wherein the first attractive force is an electrostatic force.

16. The system of claim 14 wherein the first attractive force is selected from the group consisting of a vacuum-generated force and a magnetic force.

17. The system of claim 14 wherein the first chuck is operative for imparting a second attractive force only on the first major surface.

18. The system of claim 17 wherein each of the first attractive force and second attractive force is an electrostatic force.

19. The system of claim 12 wherein the second chuck is dimensioned and arranged to effect a curvature of the shadow mask.

20. The system of claim 12 wherein the second chuck includes a support grid that is located within the first opening, and wherein the support grid is dimensioned and arranged to physically support the shadow mask.

21. The system of claim 12 further including:
a source for providing vaporized atoms comprising the material, wherein the source provides the vaporized atoms such that they propagate along directions within a first angular range relative to the second major surface; and
a collimator that is dimensioned and arranged to selectively pass vaporized atoms travelling along directions within a second angular range that is smaller than the first angular range;
wherein the collimator, source, and shadow mask are arranged such that the collimator is between the source and the shadow mask.

22. The system of claim 21 wherein the alignment system is operative for effecting relative motion between the collimator and the substrate during deposition of the pattern of material on the substrate.

23. A method for depositing a pattern of material on a first region of a substrate through an arrangement of through-holes in a shadow mask, wherein the substrate includes a first major surface and a second major surface having a first lateral extent, the second major surface comprising the first region, and wherein the shadow mask includes a third major surface and a fourth major surface that comprises the through-holes, the method comprising:
holding the substrate in a first chuck that imparts a first attractive force selectively on the first major surface;
holding the shadow mask in a second chuck that imparts a second attractive force selectively between the mounting surface and the third major surface, the second chuck including a frame that completely surrounds a first opening that enables passage of particles comprising the material through the second chuck to the through-holes, wherein the frame includes an annular mounting surface that is configured to induce a tensile stress in the fourth major surface when the shadow mask is held in the second chuck, and wherein the frame has a cross-section in which the mounting surface extends between a first edge that is proximal to the first opening and a second edge that is distal to the first opening, and further wherein the mounting surface and first edge meet at a point in a first plane and the mounting surface and the second edge meet at a point in a second plane, the first plane being closer to the substrate than the second plane when the shadow mask and substrate are aligned;

aligning the substrate and the shadow mask such that the second major surface and the fourth major surface are separated by a distance that is less than or equal to 10 microns; and passing a flow of particles comprising the material through the second chuck and the shadow mask.

24. The method of claim 23 wherein the substrate and shadow mask are aligned such that the second major surface and the fourth major surface are separated by a distance that is greater than 0 microns and less than or equal to 10 microns.

25. The method of claim 23 wherein the substrate and shadow mask are aligned such that the second major surface and the fourth major surface are separated by a distance that is within the range of approximately 2 microns to approximately 5 microns.

26. The method of claim 23 further comprising generating the second attractive force as an electrostatic force.

27. The method of claim 26 further comprising generating the first attractive force as an electrostatic force.

28. The method of claim 23 further comprising generating the second attractive force as a force selected from the group consisting of a vacuum-generated force and a magnetic force.

29. The method of claim 23 wherein the mounting surface is non-planar.

30. The method of claim 23 wherein the mounting surface is configured to induce a curvature of the shadow mask.

31. The method of claim 23 further comprising mechanically supporting the shadow mask in a region of the shadow mask that includes the through-holes.

32. The method of claim 31 further comprising providing the second chuck such that it includes a support grid that is located in the first opening, wherein the support grid is dimensioned and arranged to physically support at least a portion of the shadow mask.

33. The system of claim 23 further including:

providing a first plurality of vaporized atoms comprising the material such that the first plurality of vaporized atoms propagate toward the shadow mask along directions within a first angular range relative to the second major surface; and selectively enabling a second plurality of vaporized atoms to reach the shadow mask, the first plurality of vaporized atoms including the second plurality of vaporized atoms, wherein the second plurality of vaporized atoms propagate along directions within a second angular range relative to the second major surface;

wherein the second angular range is smaller than the first angular range.

* * * * *